United States Patent [19]
Kitada et al.

[11] Patent Number: 5,337,203
[45] Date of Patent: Aug. 9, 1994

[54] MAGNETORESISTIVE MAGNETIC HEAD

[75] Inventors: Masahiro Kitada, Hamura; Hideo Tanabe, Higashimurayama; Noboru Shimizu, Tokorazawa; Naoki Koyama, Kokubunji; Toshio Kobayashi, Nishitama, all of Japan

[73] Assignee: Hitachi, Ltd., Tokyo, Japan

[21] Appl. No.: 873,785

[22] Filed: Apr. 27, 1992

Related U.S. Application Data

[60] Continuation-in-part of Ser. No. 655,033, Feb. 14, 1991, which is a division of Ser. No. 310,922, Feb. 16, 1989, Pat. No. 5,010,433.

[30] Foreign Application Priority Data

Apr. 26, 1991 [JP] Japan .................... 3-096796

[51] Int. Cl.⁵ .................................... G11B 5/39
[52] U.S. Cl. ....................................... 360/113
[58] Field of Search ........................... 360/113

[56] References Cited

U.S. PATENT DOCUMENTS 4,907,114 3/1990 Shiiki ........................ 360/113

Primary Examiner—A. J. Heinz
Attorney, Agent, or Firm—Antonelli, Terry, Stout & Kraus

[57] ABSTRACT

A magnetoresistive head having a structure based on a two-layer film having a first film exhibiting a magnetoresistive effect and a second film comprising Nb and at least one element selected from the group consisting of Ti, Cr, Mo, Zr, W, Pt, Re, V, Hf, Ta, Rh, Ni and Ru as an additive element.

34 Claims, 6 Drawing Sheets

MAGNETORESISTIVE MAGNETIC HEAD

SPECIFIC REFERENCE TO THE EARLIER FILED APPLICATION

This is a continuation-in-part application of Ser. No. 07/655,033 which has been filed Feb. 14, 1991 and is a divisional application of Ser. No. 07/310,922 filed Feb. 16, 1989 and issued as U.S. Pat. No. 5,010,433.

BACKGROUND OF THE INVENTION

The present invention concerns a magnetic head for magnetic recording apparatus and, particularly, it relates to an improvement in Nb materials used therefor and provides a magnetoresistive head suitable for reading for high density magnetic recording.

The Nb material in the present invention is used, particularly, for a shunt film of a magnetic head using a shunt bias type magnetoresistive device having a shunt film for the application of bias. Further, it is also used as an intermediate film between a soft magnetic film and a magnetoresistive film of a magnetic head using a soft bias type magnetoresistive device having a soft magnetic film for the application of bias.

For the shunt film in existent shunt bias type magnetoresistive heads, there have been used, for example, Ti, Ta, Mo, Nb or the like as described in U.S. Pat. No. 4,663,684, Ti, Cr, Ta, Zr, Hf, TiW alloy or the like as described in U.S. Pat. No. 4,914,538 and Cr, Ta, W, Nb or the like as described in U.S. Pat. No. 5,005,096.

For a magnetoresistive film, a Ni-Fe alloy film, Ni-Co alloy film or Ni-Fe-Co film is used usually, and a shunt film is used together with the magnetoresistive film in the state of a dual layer film. Usually, an electric current greater than $10^6$ A/cm$^2$ is supplied and shunted into each of the films, to generate a bias field in the shunt film and cause a resistance change in the magnetoresistive film due to magnetic resistance.

As the properties required for the shunt film, it has to satisfy such conditions that it has an appropriate electric resistance value relative to the magnetoresistive film so as to provide current shunting that causes an optimum bias field in the dual layer film with the magnetoresistive film, causes no reaction as deteriorating the magnetoresistive film in the manufacturing step of a magnetoresistive device, has excellent corrosion resistance and an easy film forming property and shows less scattering of the electric resistance.

Further, as a bias field generation means, there is a soft bias type magnetoresistive head using a soft magnetic film and having a three-layer structure consisting of a soft magnetic film, a spacer metal film and a magnetoresistive film. As the prior art, there can be mentioned U.S. Pat. Nos. 4,663,685 and 5,001,586.

However, in such a three-layer structure, it is useless that a current flows to the soft magnetic film, and high specific resistivity is desired for the spacer metal film in order to prevent the reduction of the current flowing in the magnetoresistive film. Further, It is of course required also for the spacer metal film that the film has reaction resistance, corrosion resistance and easy film forming property, and has no scattering of the electric resistance as described above.

SUMMARY OF THE INVENTION

In view of the reaction with the magnetoresistive film in the prior art described above, Ti reacts with the magnetoresistive film at 175°–200° C., Mo, Ta and Zr are poor in the corrosion resistance and have high electric resistance although they are not reacted up to about 350° C., Cr or the alloy thereof has a low reaction temperature like that Ti as described in Japanese Patent Laid-Open No. Sho 62-183003. Further, other prior arts except for Nb show characteristics similar to the materials described above.

Nb has a high temperature for starting the reaction with the magnetoresistive film and excellent corrosion resistance and it is excellent material for the shunt film. Usually, the electric resistance of an Nb film formed by vapor deposition or sputtering is 25 to 35 $\mu$.ohm.cm but it has a drawback that the electric resistance tends to vary under the effect of residual oxygen or nitrogen in a film-forming atmosphere.

Further, for the improvement of the output of the magnetoresistive head, it is necessary to use a magnetoresistive film of a reduced thickness and the thickness of the shunt film has to be reduced correspondingly. The thickness of the magnetoresistive film is 5 to 50 nm and the mean free path of electrons in a metal film is about 30 nm. Accordingly, if the thickness of the magnetoresistive film is reduced to about 30 nm, a phenomenon that electrons are scattered by colliding against the surface of the film becomes remarkable. Accordingly, in a shunt film of less than 30 nm thickness, variation of the electric resistance also becomes extremely remarkable. For controlling the bias field, it is essential to control the film thickness and the electric resistance, but variation of the electric resistance in a region of the film thickness reaches as great as 20 to 30% in the Nb film fabricated by a usual forming method. Since variation is also caused in the film thickness, it gives a significant effect for the control of the current shunting with respect to the magnetoresistive film, so that it is very much difficult to fabricate a shunt bias type magnetoresistive head having satisfactory characteristic without any variation.

Further, also in the soft bias type magnetic head, it is necessary to make the resistance higher by reducing the thickness of the spacer film as small as possible in order to prevent a sense current in the magnetoresistive film from shunting to the soft magnetic film. However, this also brings about a variation problem of the resistance in the spacer film as described above.

In the existent magnetoresistive head, reduction for the variation of the electric resistance in the shunt film or the spacer film is not taken into consideration when the thickness of the magnetoresistive film is reduced as low as 5 to 30 nm and there have not been known a magnetoresistive head having satisfactory characteristics without any variation and a manufacturing method therefor.

A first object of the present invention is to provide a Nb series alloy metal material which is advantageous for use in a magnetoresistive head.

A second object of the present invention is to provide a shunt film optimum to a high output head having a thin magnetoresistive film among shunt bias type magnetoresistive heads.

A third object of the present invention is to provide a spacer metal layer suitable for a soft bias type head.

For attaining the foregoing objects, in a magnetoresistive head according to the present invention, a secondary metal is added to Nb, to control the value of the electric resistance without deteriorating the high corrosion resistance or satisfactory reaction characteristics with the magnetoresistive film inherent to Nb, thereby overcoming the drawback of Nb in the prior art.

The magnetoresistive head according to the present invention has a structure based on a dual layer film having a first film showing a magnetoresistive effect and a second film comprising one or more elements selected from the group consisting of Cr, Mo, Zr, W, Pt, Re, V, Hf, Ta, Rh, Ni and Ru.

A shunt bias type head is provided in the case where the second film is a shunt film for applying a bias field to the first film and a soft bias head is provided in the case where a third film showing a soft magnetic property is stacked by way of a second film to the first film.

Further, the material is also excellent as the material for the magnetoresistive head in addition to the above-mentioned application uses.

In the case of adding the second element to Nb to form a shunt film, the resistance value has to be within a range suitable for current shunting with respect to the magnet resistive effect. The resistance value is preferably about three times of the electric resistance of the magnetoresistive film. If the resistance is too high, since the thickness of the shunt film has to be increased, dissipation of heat generated by a current is worsened to extremely shorten the device life. Further, the gap in the shield type magnetoresistive device cannot be decreased.

When an element is added to Nb, a solid solution is generally formed if the addition amount is small. However, it results in a two phases structure comprising an inter-metallic compound and a Nb solid solution inherent to the alloy system except for the entire ratio solid solubilized alloy system, to result in an increase or variation in electric resistance and degradation of the corrosion resistance. Accordingly, the state of solid solution is desirable. That is, since the two phase structure changes greatly depending on the conditions of the heat treatment, the change in electric resistance is also remarkable.

For the reaction with the magnetoresistive film, since the temperature for starting the reaction is lowered as the melting point of the alloy is lowered due to alloying of Nb, it is necessary that the melting point of the Nb alloy is higher than about 2,000° C. If it is lower than 2,000° C., the temperature for starting reaction with the magnetoresistive film is reduced lower than 350° C. which is not preferable in view of the heat resistance. The range of the addition amount of the element in the Nb alloy capable of satisfying such conditions varies depending on the additive element, and it has to be decided based on detailed studies for the electric resistance, the corrosion resistance and the temperature for starting reaction with the magnetoresistive film on every alloy system.

When the second element is added to Nb, the electric resistance is increased as compared with that of pure Nb. An increase in electric resistance of the Nb alloy per unit addition amount varies depending on the kind of the additive element. Generally, it is linear in a region with less addition amount, but the linearity becomes lost if the addition amount is increased as shown in FIG. 1. As described above, the electric resistance of the Nb film differs depending on the preparation method, and it changes greatly also depending on the purity of the Nb and the additive element used. Description will be made here based on the case of using a starting material at a purity of 99.9–99,999 wt. % usually used for industrial application. In the resistance value shown in FIG. 1, the range for the electric resistance value usable for the shunt film is up to about three times of the magnetoresistive film as described above. In the magnetoresistive film described above, the electric resistance is from 15 to 35 $\mu.ohm.cm$ with the film thickness of from 5 to 30 nm, and the electric resistance of the Nb alloy film as the shunt film is about up to 105 $\mu.ohm.cm$ and it can be used as the shunt film within the above-mentioned range.

Referring to the reaction with the magnetoresistive film as a result of the study on the reaction between the Nb alloy film having various melting points by alloying and the magnetoresistive film described above, as shown in FIG. 2, the temperature for the starting of the reaction between them is in proportion with the melting point of the alloy. Assuming the heating temperature required in the step of manufacturing the magnetoresistive head to be 300° C., it is necessary that the temperature for starting the reaction is higher by about 10 to 20% compared therewith. Assuming the starting temperature to be 350° C., an alloy composition capable of satisfying this has to be selected.

In view of the relationship shown in FIG. 3, the melting point of the Nb alloy capable of satisfying the reaction temperature at 350° C. is higher than 2,000° C.

Referring to the variation in electric resistance, the dependence of the electric resistance of the Nb alloy on the film thickness is shifted as a whole toward high resistance relative to Nb as shown in FIG. 3. Assuming the resistance value in a region where the electric resistance of Nb has no dependence on the film thickness to be $\rho_0$, the resistance value in a region where there is a dependence on the film thickness as $\rho_t$, the resistance value in a region where the Nb alloy has no dependence on the film thickness as $\rho_{01}$ and the resistance value in a region where there is a dependence on the film thickness as $\rho_{t1}$ in FIG. 3, $(\rho_{t1}-\rho_{01})/\rho_{01}$ is smaller as compared with $(\rho_t-\rho_0)/\rho_0$. Further, when the electric resistance variation $\Delta\rho_0$ of the Nb film and $\Delta\rho_{01}$ of the Nb alloy in a region where there is a dependence on the film thickness are compared, $\Delta\rho_{01}$ is smaller.

For compliance with the increasing density of magnetic recording devices, it is necessary to increase the current by reducing the film thickness of the magnetoresistive film, and the shunting ratio between the shunt film and the magnetoresistive film scatters along with the decrease in the film thickness with the reason as described above. For reducing the scattering, it is necessary to provide a power source for supplying current to the device with such a circuit function as reducing the variation. However, the burden imposed on the power source is also moderated remarkably according to the present invention. Further, since the error rate in the signal reproduction in recording/reproduction is reduced, burden on the error correction circuit is also reduced remarkably. Accordingly, a magnetic memory device with a extremely low error ratio can be realized.

With the functions as described above, variation in electric resistance of the Nb alloy film is reduced as compared with the Nb film, and the variation in the bias field intensity and the output characteristics of the magnetoresistive effect can be reduced.

Another object of the present invention is to provide a material suitable to a magnetoresistive head using a thin film. This is a thin film material for the magnetoresistive head comprising Nb as the main ingredient and at least one additive element selected from the group consisting of Cr, Mo, Zr, W, Pt, Re, V, Hf, Ta, Rh, Ni and Ru. The amount of the additive element is less than 30 at. % for Ti in view of the reaction resistance, less than 12 at. % for Zr in view of the corrosion resistance, less than 22 at. % for V in view of the reaction resistance, less than 27 at. % for Hf in view of the reaction resistance, less than 6 at. % for W in view of the corrosion resistance, less than 27 at. % for Ta in view of the reaction resistance, less than 37 at. % for Ru in view of the reaction resistance, less than 27 at. % for Rh in view of the reaction resistance, less than 17 at. % for Re in view of the reaction resistances less than 12 at. % for Pt in view of the reaction resistance, less than 6 at. % for Cr in view of the reaction resistance, and less than 9 at. % for Mo in view of the corrosion resistance.

Particularly, preferred contents of the additive element as the magnetoresistive head material are:
1 to 25 at. % for Ti,
0.5 to 10 at. % for Zr,
3 to 20 at. % for V,
1 to 25 at. % for Hf,
0.5 to 5 at. % for W,
3 to 25 at. % for Ta,
3 to 35 at. % for Ru,
3 to 25 at. % for Rh,
3 to 15 at. % for Re,
1 to 10 at. % for Pt
3 to 25 at. % for Ni,
0.2 to 5 at. % for Cr, and
3 to 8 at. % for Mo.

DETAILED DESCRIPTION OF THE PREFERRED EMBODIMENTS

Preferred embodiments according to the present invention will now be described more specifically with reference to drawings.

Example 1

An Nb-Ti alloy in which 1 to 35 at. % of Ti was added into Nb was prepared by a vacuum melting process, from which a source for electron beam vapor deposition and a target for sputtering were cut out. Thin films were formed by using them by deposition on glass substrates by way of electron beam vapor deposition and sputtering.

Figure 1:
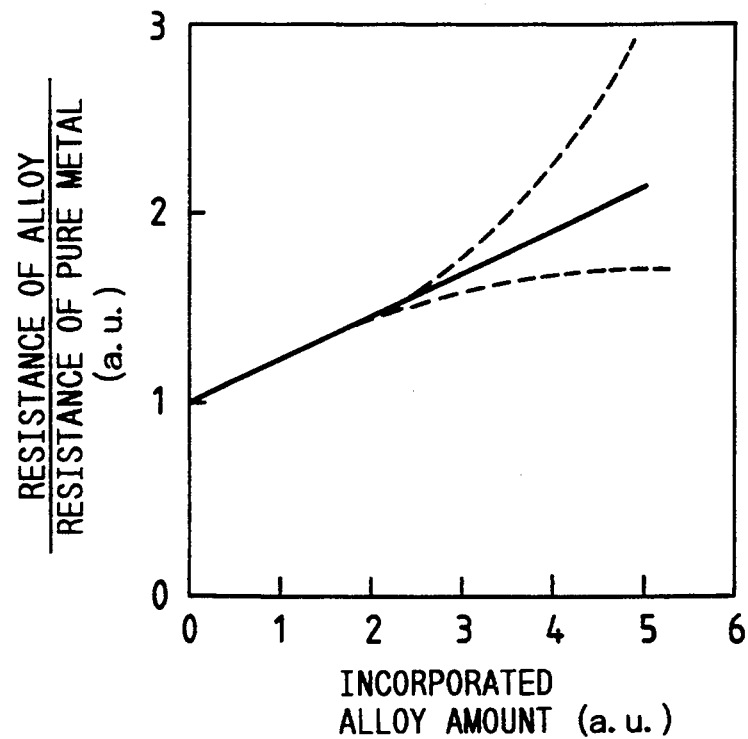
FIG. 1 is a graph illustrating a general relation between an addition amount of an alloy and change in resistance of the alloy.
Figure 2:
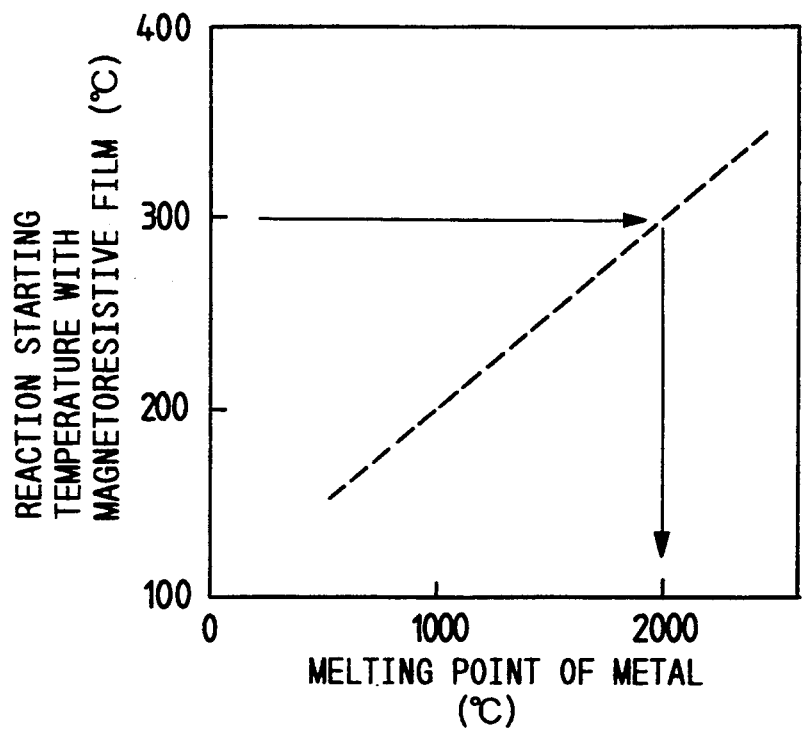
FIG. 2 is a graph illustrating a temperature for the reaction between a magnetoresistive film and an Nb alloy film.
Figure 3:
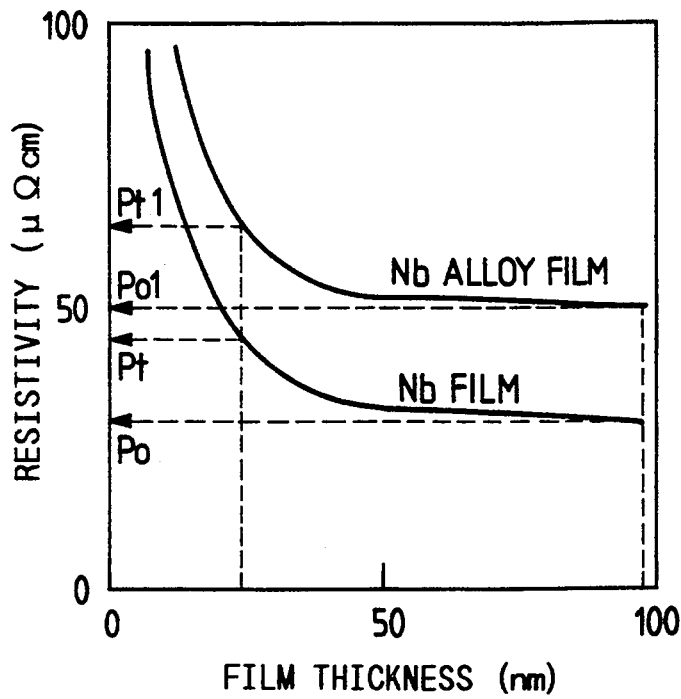
FIG. 3 is a graph illustrating a relation between the variation in electric resistance and the film thickness of an Nb film and the Nb alloy film.
Figure 4:
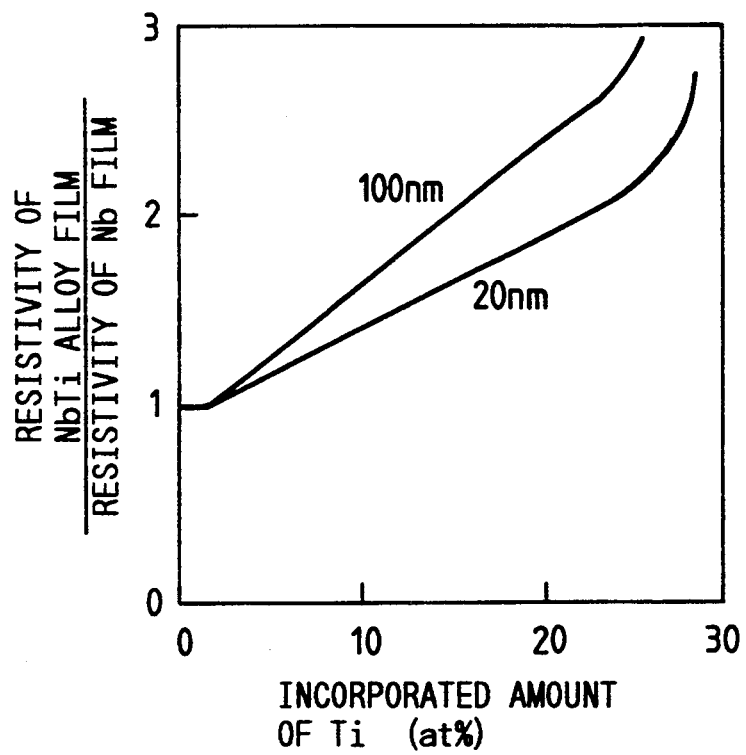
FIG. 4 is a graph illustrating the dependence of the change in electric resistance on the addition amount of Ti into an Nb-Ti alloy.

FIG. 4 shows the dependence of the electric resistance of the thin films on the addition amount of Ti. As typical examples of the film thickness, there are shown 100 nm in a region where the electric resistance has no dependence on the film thickness and 20 nm in a region where electrons are scattered at the surface of the film to cause film thickness dependence. In this case, the electric resistance is shown relative to the electric resistance of Nb as a standard. Irrespective of the film thickness, the electric resistance of the Nb-Ti alloy film shows no remarkable increase up to 1 at. % of Ti amount, shows distinct increase if the Ti amount is greater than 1 at. %, the resistance increases substantially linearly up to 25 at. % and remarkably increases in excess of 25 at. %.

As has been described above, it is desirable that the resistance of the metal film used for a shunt film of the magnetoresistive device is 1 to 3 times of the resistance of the magnetoresistive film. Since the resistance of the magnetoresistive film prepared usually is from 15 to 30 $\mu$.ohm.cm, a desired upper limit of the resistance of the Nb alloy for the shunt film is about 90 $\mu$.ohm.cm, and the preferred Ti addition amount as the shunt film is less than 25 at. %.

Further, considering the addition amount of Ti in a region where the effect of $(\rho_{t1} - P_{01})/\rho_{01}$ becomes remarkable, 5 to 20 at. % of the Ti addition amount is more effective. It is estimated that the resistance less increases if the Ti addition amount is smaller, because Ti has a getter effect of reacting with residual gases such as oxygen in the atmosphere in film-forming step such as vapor deposition, thereby reducing the amount of impurity gases mixed into Nb.

Within a range of the Ti amount from 1 to 5 at. %, the increase in resistance of the Nb alloy film is not so remarkable, and variation of the resistance is reduced to about $\frac{1}{3}$-$\frac{1}{2}$ compared with the Nb film due to the getter effect of Ti. Accordingly, addition of Ti has an effect of reducing the scattering of the electric resistance of the shunt film due to the getter effect.

Figure 5:
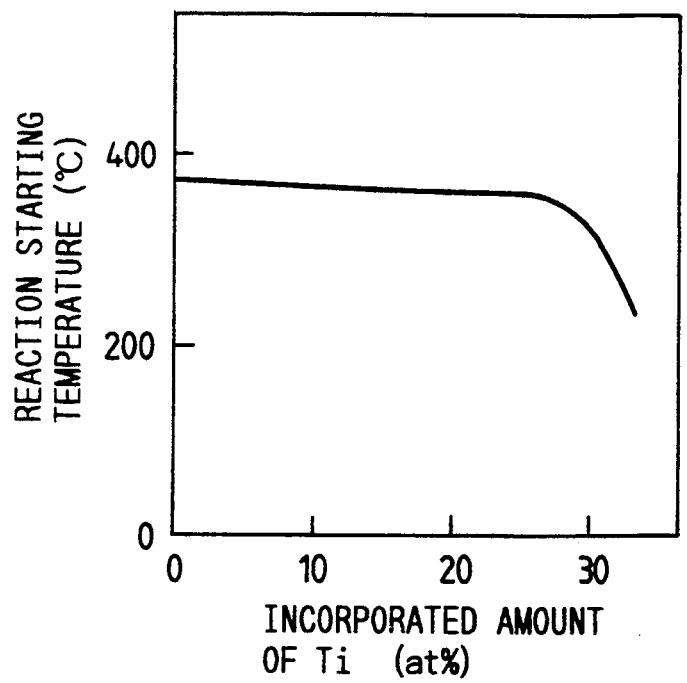
FIG. 5 is a graph illustrating the dependence of the temperature for the reaction between the Nb-Ti alloy and the magnetoresistive film on the addition amount of Ti.

On the other hand, when the reaction between the Ni-19 at. % Fe alloy film as the magnetoresistive film and the Ni-Ti alloy film was examined by a heat treatment in vacuum as shown in FIG. 5, the reaction temperature lowers to 350° C. at the addition amount of Ti near 28 at. % and lower than 350° C. at the addition amount of Ti near 30 at. %. If the highest temperature of the heat treatment in a head manufacturing step is higher than 300° C., addition of Ti greater than 30 at. % is not practical for the head material.

After the above-mentioned study, magnetoresistive heads were fabricated by using Nb, Nb-1 at. % Ti, Nb-5 at. % Ti, Nb-10 at. % Ti, Nb-20 at. % Ti, Nb-25 at. %

Ti, Nb-39 at. % Ti as the shunt film and using Ni-19 at. % Fe, Ni-50 at. % Co, Ni-10 at. % Fe-9 at. % Co as the magnetoresistive film.

As a result, the variation in bias field intensity in the head due to the variation in electric resistance of the shunt film was reduced to less than $\frac{1}{3}-\frac{1}{2}$ in each of the case of the Nb-Ti alloy as compared with the case of Nb when comparison was made with respect to the vertical asymmetricity of the output waveform of the head. When heads were fabricated by using a Ni-Fe magnetoresistive film containing 7-27 at. % of Fe, a Ni-Co magnetoresistive film containing 30-50 at. % of Co and a Ni-Fe-Co magnetoresistive film containing 3-18 at. % of Fe and Ni-Fe-Co magnetoresistive film containing 3-15 at. % of Co and the balance of Ni and then evaluated, reduction of the variation in the head characteristics due to the effect of reducing the scattering the electric resistance of the shunt film was confirmed.

Example 2

In the same procedures as those in Example 1, the electric resistance and the variation thereof were examined for a Nb-Zr alloy in which 0.5 to 35 at. % of Zr was added to Nb.

Figure 6:
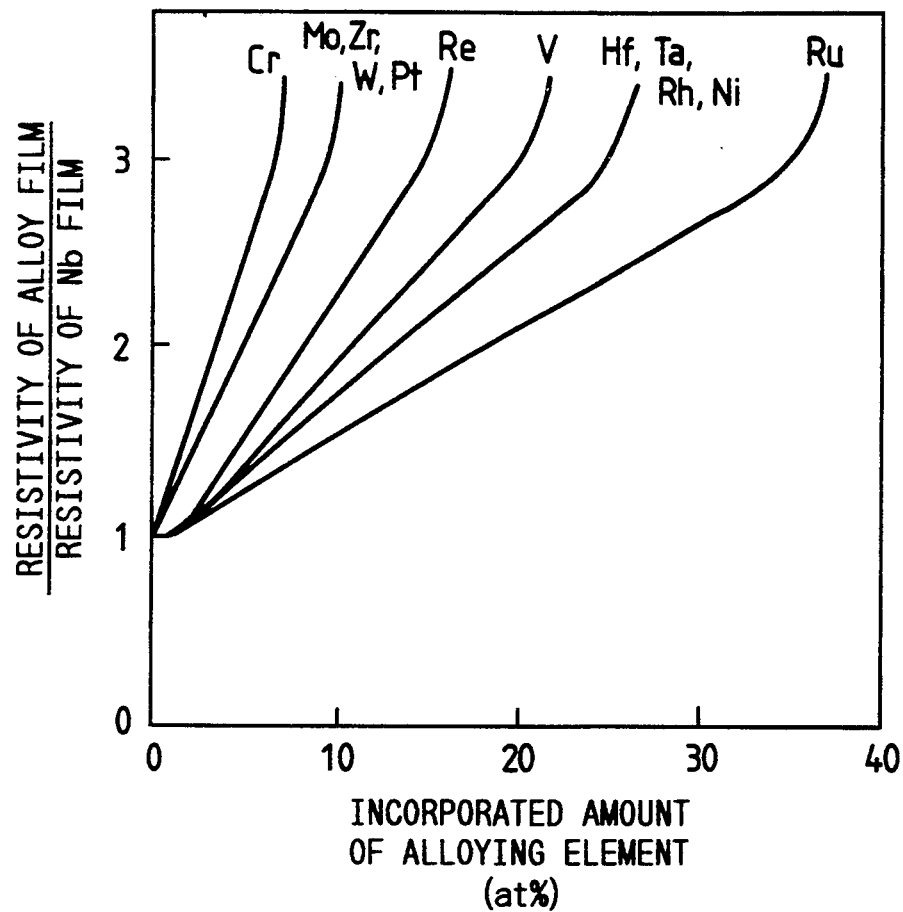
FIG. 6 is a graph illustrating a relation between the specific resistivity of various kinds of Nb alloys and the addition amount of additive elements.

As shown in FIG. 6, in the case of a Nb-Zr alloy film, no remarkable increase is shown up to 0.5 at. % of the Zr amount, the increase becomes distinct if the Zr amount exceeds 0.5 at. %, it increases substantially linearly up to 10 at. % and remarkably increases if it exceeds 10 at. %. It is considered that such an abrupt increase of the resistance is caused by the formation of a two phases structure. Since the resistance value of the metal film used as the shunt film of the magnetoresistive device is desirably 1 to 3 times of the resistance value of the magnetoresistive film and, assuming the upper limit for the resistance of the Nb alloy usable for the shunt film as about 90 $\mu$.ohm.cm, the addition amount of Zr usable for the shunt film is 0.5 to 10 at. %.

Further, considering the addition amount of Zr in a region where the effect of $(\rho t1 - \rho_{01})/\rho_{01}$ becomes remarkable, 2.5 to 10 at. % of the Zr addition amount is more effective. It is estimated that the resistance less increases if the Zr addition amount is smaller, because Zr has a getter effect of reacting with residual gases such as oxygen in the atmosphere in film-forming step such as vapor deposition, thereby reducing the amount of impunity gases mixed into Nb in the same manner as in the case of Ti.

Within a range of the Zr amount from 0.5 to 2.5 at. %, increase in resistance of the Nb alloy film is not remarkable, and the scattering of the resistance is reduced to about $\frac{1}{3}-\frac{1}{2}$ due to the Zr getter effect as compared with the Nb film. Accordingly, addition of Zr also has an effect of reducing the variation in electric resistance of the shunt film due to the getter effect.

On the other hand, when the reaction between a Ni-19 at. % Fe alloy film as the magnetoresistive film and a Ni-Zr alloy film was examined by a heat treatment in a vacuum, the reaction temperature showed no particular change but was kept higher than 350° C. if the addition amount of Zr was increased. However, the material with greater addition amount of Zr, for example, an Nb-Zr alloy with Zr being more than 12 at. % is not practical as the head material since the corrosion resistance is reduced remarkably.

After the above-mentioned study, magnetoresistive heads were fabricated by using Nb, Nb-0.5 at. % Zr, Nb-2.5 at. % Zr, Nb-5 at. % Zr, Nb-7.5 at. % Zr, Nb-10 at. % Zr as the shunt film and using Ni-19 at. % Fe, Ni-50 at. % Co, Ni-10 at. % Fe-9 at. % Co as the magnetoresistive film.

As a result, the variation in the bias field intensity in the head due to the variation in electric resistance of the shunt film was reduced in the case of the Nb-Zr alloy to less than $\frac{1}{3}-\frac{1}{2}$ as compared with the case of Nb when comparison was made with respect to the vertical asymmetricity of the output waveform of the head. When heads were fabricated by using a Ni-Fe magnetoresistive film containing 7-27 at. % of Fe, a Ni-Co magnetoresistive film containing 30-50 at. % of Co and a Ni-Fe-Co magnetoresistive film containing 3-18 at. % of Fe, 3-15 at. % of Co and the balance of Ni and then evaluated, reduction of the variation in head characteristics due to the effect of reducing the variation in electric resistance of the shunt film was confirmed.

Example 3

The electric resistance and the variation thereof were examined for a Nb-V alloy in which 1-35 at. % of V was added to Nb in the same procedures as in Examples 1 and 2, and the addition amount of V usable for the shunt film was examined. As a result, a range from 3 to 20 at. % is effective in the case of V (FIG. 6).

Also in the case of adding V, the resistance increases remarkably if the addition amount exceeds 20 at. %. Further, when reaction between the Ni-19 at. % Fe alloy and the Nb-V alloy film was examined by applying a heat treatment in vacuum, the reaction temperature was lowered along with the increase of the addition amount of V and reduced to lower than 350° C. near Nb-22 at. % V. Accordingly, the Nb-V alloy with more than 22 at. % V is not practical as the head material if the temperature exceeds 300° C., depending on the highest heat treatment temperature in the head fabrication step.

Further, although the resistance of the Nb film less changes if the addition amount of V is less than 3 at. %, no remarkable effect can be seen for reducing the variation in electric resistance of the shunt film unless it is added by more than 3 at. %. Also in the case of V, it is considered that the reduction of the variation in resistance within a range of small addition amount is mainly attributable to the getter effect of V. However, since the getter effect of V is weak as compared with Ti or Zr, it seems that the addition amount has to be increased somewhat. However, the variation in the resistance when it is added by more than 3 at. % was reduced to $\frac{1}{3}-\frac{1}{2}$ as compared with the Nb film.

After the above-mentioned study, magnetoresistive heads were fabricated in the same way as in the case of adding Ti and Zr by using a Nb-V alloy film as the shunt film and using Ni-19 at. % Fe, Ni-50 at. % Co, Ni-10 at. % Fe-9 at. % Co as the magnetoresistive film.

As a result, the variation in the bias field intensity in the head due to the variation in electric resistance of the shunt film was reduced in each of the cases to less than $\frac{1}{3}-\frac{1}{2}$ as compared with the case of the Nb film when comparison was made with respect to the vertical asymmetricity of the output waveform of the head. When heads were fabricated by using a Ni-Fe magnetoresistive film containing 7-27 at. % of Fe, a Ni-Co magnetoresistive film containing 30-50 at. % of Co and a Ni-Fe-Co magnetoresistive film containing 3-18 at. % of Fe, 3-15 at. % of Co and the balance of Ni and then evaluated in the same way, reduction of the variation of the head characteristics due to the effect of reducing the variation in electric resistance of the shunt film was confirmed.

Example 4

The electric resistance and the variation thereof were examined for a Nb-Hf alloy in which 0.5–35 at. % of Hf was added to Nb in the same procedures as in Examples 1 and 2, and the addition amount of Hf usable for the shunt film was examined. As a result, a range from 1 to 25 at. % is effective in the case of Hf (FIG. 6).

Also in the case of adding Hf, the resistance increases remarkably if the addition amount exceeds 25 at. %. Further, considering the addition amount of Hf in a region where the effect of $(\rho_{t1} - \rho_{01})/\rho_{01}$ becomes remarkable. The addition amount of Hf from 5 to 25 at. % is more effective.

Further, when reaction between the Ni-19 at. % Fe alloy and the Nb-Hf alloy film was examined by applying a heat treatment in a vacuum, the reaction temperature was lowered along with the increase of the addition amount of Hf and reduced to lower than 350° C. near Nb-27 at. % Hf. Accordingly, the Nb-Hf alloy with more than 27 at. % Hf is not practical as the head material if the highest heat treatment temperature exceeds 300° C. in the head manufacturing step. Further, although the resistance of the Nb film less changes if the addition amount of Hf is less than 1 at. %, no effect for reducing the variation in electric resistance of the shunt film can be seen unless it is added by more than 1 at. %. The variation in resistance when it is added by more than 1 at. % was reduced to $\frac{1}{3} - \frac{1}{2}$ as compared with the Nb film as in the case of adding Ti or Zr.

After the above-mentioned study, magnetoresistive heads were fabricated in the same way as in the case of adding Ti and Zr by using a Nb-Hf alloy film as the shunt film and using Ni-19 at. % Fe, Ni-50 at. % Co, Ni-10 at. % Fe-9 at. % Co as the magnetoresistive film. As a result, the variation in the bias field intensity in the head due to the variation in electric resistance of the shunt film was reduced in each of the cases to less than $\frac{1}{3} - \frac{1}{2}$ as compared with the case of the Nb film when comparison was made with respect to the vertical asymmetricity of the output waveform of the head. When heads were fabricated by using a Ni-Fe magnetoresistive film containing 7–27 at. % of Fe, a Ni-Co magnetoresistive film containing 30–50 at. % of Co and a Ni-Fe-Co magnetoresistive film containing 3–18 at. % of Fe, 3–15 at. % of Co and the balance of Ni and then evaluated in the same way, reduction of the variation in the head characteristics due to the effect of reducing the variation in electric resistance of the shunt film was confirmed.

Example 5

In the same procedures as those in Examples 1 and 2, the electric resistance and the variation thereof were examined for a Nb-W alloy, in which 0.5–35 at. % of W was added to Nb. In the case of the Nb-W alloy film, the resistance does not increase remarkably up to 0.5 at. % of W, increases distinctly if the amount exceeds 0.5 at. %, and increases substantially linearly up to 10 at. % and increases abruptly if the amount exceeds 10 at. % (FIG. 6).

As has been described above, the resistance of the metal film used for the shunt film in the magnetoresistive device is desirably 1 to 3 times of the resistance of the magnetoresistive film and, assuming the upper limit of the resistance of the Nb alloy usable for the shunt film to be about 90 $\mu.ohm.cm$, the addition amount of W usable in the shunt film is from 0.5 to 10 at. %.

Further, considering the addition amount of W in a region where the effect of $(\rho_{t1} - \rho_{01})/\rho_{01}$ described above becomes remarkable, it is considered that the addition amount of W from 2.5 to 10 at. % is more effective.

In the case of W, when the reaction with the Ni-19 at. % Fe alloy film as the magnetoresistive film, and the corrosion resistance were examined, the reaction temperature showed no remarkable change even at an addition amount of 10 at. % and was kept higher than 350° C., but the corrosion resistance was remarkably reduced by the addition of W. In view of the corrosion resistance, the Nb-W alloy with more than 6 at. % W is not practical as the head material.

Accordingly, addition amount from 0.5 to 5 at. % of W is appropriate for the shunt film, and the variation in resistance of the Nb-W alloy film within the above range was reduced to about $\frac{1}{3} - \frac{1}{2}$ as compared with the Nb film. Accordingly, it is considered that addition of W also has an effect of reducing the scattering of the electric resistance of the shunt film.

After the above-mentioned study, magnetoresistive heads were fabricated, in the same way as in the case of adding Ti and Zr, by using a Nb-W alloy film as the shunt film and using Ni-19 at. % Fe, Ni-50 at. % Co, Ni-10 at. % Fe-9 at. % Co as the magnetoresistive film.

As a result, the variation in the bias field intensity in the head due to the variation in electric resistance of the shunt film was reduced in each of the cases to less than $\frac{1}{3} - \frac{1}{2}$ as compared with the case of Nb when comparison was made with respect to the vertical asymmetricity of the output waveform of the head.

When heads were fabricated by a using a Ni-Fe magnetoresistive film containing 7–27 at. % of Fe, a Ni-Co magnetoresistive film containing 30–50 at. % of Co and a Ni-Fe-Co magnetoresistive film containing 3–18 at. % of Fe, 3–15 at. % of Co and the balance of Ni and then evaluated in the same way, reduction of the variation in the head characteristics due to the effect of reducing the variation in electric resistance of the shunt film was confirmed.

Example 6

The electric resistance and the variation thereof were examined for a Nb-Ta alloy in which 0.5–35 at. % of Ta was added to Nb in the same procedures as in Examples 1 and 2, and the addition amount of Ta usable for the shunt film was examined. As a result, a range from 3 to 25 at. % is effective in the case of Ta.

Also in the case of adding Ta, the resistance remarkably increases if the addition amount exceeds 25 at. % (FIG. 6). Further, the temperature of the reaction with the Ni-19 at. % Fe alloy film is lowered along with the increase of the Ta addition amount and it is reduced lower than 350° C. near Nb-27 at. %. Accordingly, the Nb-Ta alloy with more than 27 at. % Ta is not practical as the head material if the temperature exceeds 300° C. depending on the highest heat treatment temperature in the head fabrication step.

It has been confirmed that the effect of reducing the variation in electric resistance of the shunt film due to the addition of Ta within a range of 3 to 25 at. % was reduced to about $\frac{1}{3} - \frac{1}{2}$ as compared with the Nb film, in the same way as in the case of adding Ti or Zr.

After the above-mentioned study, magnetoresistive heads were fabricated in the same way as in the case of adding Ti and Zr by using a Nb-3-25 at. % Ta alloy film as the shunt film and using a Ni-19 at. % Fe, Ni-50 at. % Co, Ni-10 at. % Fe-9 at. % Co as the magnetoresistive film.

As a result, variation in the bias field intensity in the head due to the variation in electric resistance of the shunt film was reduced in each of the cases to less than $\frac{1}{3}-\frac{1}{2}$ as compared with the case of the Nb film when comparison was made with respect to the vertical asymmetricity of the output waveform of the head.

When heads were fabricated by using a Ni-Fe magnetoresistive film containing 7-27 at. % of Fe, a Ni-Co magnetoresistive film containing 30-50 at. % of Co and a Ni-Fe-Co magnetoresistive film containing 3-18 at. % of Fe, 3-15 at. % of Co and the balance of Ni and then evaluated in the same way, reduction of the variation in the head characteristics due to the effect of reducing the variation in electric resistance of the shunt film was confirmed.

Example 7

In the same procedures as those in the examples described above, the electric resistance and the variation thereof were examined for a Nb-Ru alloy in which 0.5-35 at. % of Ru was added to Nb and the addition amount of Ru usable for the shunt film was examined. As a result, in the case of Ru, the resistance of Nb increases linearly to the addition amount of Ru up to 35 at. % to Nb, and the resistance value is within a range not exceeding the resistance value of about 90 $\mu$.ohm.cm of the Nb alloy usable for the shunt film. Then, when the addition amount was further increased by adding Ru up to 40 at. % and the change of the resistance of Nb was examined, it was found that the resistance increases remarkably if the addition amount exceeds 35 at. % (FIG. 6).

In view of the change in resistance, the addition amount of Ru usable for the shunt film is 3 to 35 at. %. Then, when the reaction between the Ni-19 at. % Pe alloy film and the Nb-Ru film, as well as the corrosion resistance of the Nb-Ru alloy film were examined, the reaction temperature is reduced lower than 350° C. near Nb-37 at. % Ru due to the increase of the Ru addition amount and, accordingly, the Nb-Ru alloy with more than 37 at. % Ru is not practical as the head material if the highest heat treatment temperature exceeds 300° C. in the head manufacturing step.

On the contrary, there is no problem for the corrosion resistance of the Nb-Ru alloy film at all and the corrosion resistance of the Nb film is rather improved by the addition of Ru to provide an excellent effect.

It was confirmed that the effect of reducing the variation in electric resistance of the shunt film due to the addition of Ru within the range from 3 to 35 at. % is reduced to about $\frac{1}{3}-\frac{1}{2}$ as compared with the case of the Nb film, in the same way as in the case of adding Ti and Zr. Since the addition of Ru less than 3 at. % shows less resistance change but the reduction effect is not so remarkable, addition of Ru by more than 3 at. % is effective.

After the above-mentioned study, magnetoresistive heads were fabricated, in the same way as in the case of adding Ti and Zr, an Nb-3-25 at. % Ru alloy film as the shunt film and using Ni-19 at. % Fe, Ni-50 at. % Co, Ni-10 at. % Fe-9 at. % Co as the magnetoresistive film.

As a result, variation in the bias field intensity in the head due to the variation in electric resistance of the shunt film was reduced in each of the cases to less than $\frac{1}{3}-\frac{1}{2}$ as compared with the case of the Nb film when comparison was made with respect to the vertical asymmetricity of the output waveform of the head. When heads were fabricated by using a Ni-Fe magnetoresistive film containing 7-27 at. % of Fe, a Ni-Co magnetoresistive film containing 30-50 at. % of Co and a Ni-Fe-Co magnetoresistive film containing 3-18 at. % of Fe, 3-15 at. % of Co and the balance of Ni and then evaluated in the same way, reduction of the variation in the head characteristics due to the effect of reducing the variation in electric resistance of the shunt film was confirmed. Another effect obtained by the addition of Ru is the improvement in the corrosion resistance of the Nb film. Increase in thickness of the Nb film due to oxidation under the conditions of temperature of 90° C., RH at 95% and 200 Hr was less than 1/10 as compared with Nb. This shows that Ru has a remarkable effect for the corrosion resistance of Nb.

Example 8

In the same procedures as those in the examples described above, the electric resistance and the variation thereof were examined for the Nb-Rh alloy in which 0.5-35 at. % of Rh was added to Nb and the addition amount of Rh usable for the shunt film was examined. As a result, a range from 3 to 25 at. % is effective in the case of Rh.

Also in the case of adding Rh, the resistance is remarkably increased if the addition amount exceeds 25 at. % (FIG. 6), and the reaction temperature with the Ni-19 at. % Fe alloy film is lowered along with the increase of the Rh addition amount to lower than 350° C. near Nb-22 at. %. Accordingly, the Nb-Rh alloy with more than 27 at. % Rh is not practical as the head material if the temperature exceeds 300° C., depending on the highest heat treatment temperature in the head manufacturing step.

On the contrary, there is no problem for the corrosion resistance of the Nb-Rh alloy film at all as in the case of the Nb-Rh alloy film and the corrosion resistance of the Nb film is rather improved by the addition of Rh to provide an excellent effect.

It has been confirmed that the effect of reducing the variation in electric resistance of the shunt film due to the addition of Rh within a range from 3 to 25 at. % is reduced to about $\frac{1}{3}-\frac{1}{2}$ as compared with the case of the Nb film, like that the case of adding Ti and Zr. Since the addition of Rh less than 3 at. % shows less resistance change but the reduction effect is not so remarkable, addition of Rh by more than 3 at. % is effective.

After the above-mentioned study, magnetoresistive heads were fabricated in the same way as in the case of adding Ti and Zr by using a Nb-3-25 at. % Rh alloy film as the shunt film and using Ni-19 at. % Fe, Ni-50 at. % Co, Ni-10 at. % Fe-9 at. % Co as the magnetoresistive film.

As a result, the variation in the bias field intensity in the head due to the variation in electric resistance of the shunt film was reduced in each of the cases to less than $\frac{1}{3}-\frac{1}{2}$ as compared with the case of Nb film when comparison was made with respect to the vertical asymmetricity of the output waveform of the head. When heads were fabricated by using a Ni-Fe magnetoresistive film containing 7-27 at. % of Fe, a Ni-Co magnetoresistive film containing 30-50 at. % of Co and a Ni-Fe-Co magnetoresistive film containing 3-18 at. % of Fe, 3-15 at. % of Co and the balance of Ni and then evaluated in the same way, reduction of the variation in the head characteristics due to the effect of reducing the scattering of the electric resistance of the shunt film was confirmed.

Another effect obtained by the addition of Rh is the improvement for the corrosion resistance of the Nb film. Increase for the thickness of the Nb film due to oxidation under the conditions of temperature of 90° C., Rh at 95% and 200 Hr was less than 1/10 as compared with Nb. This shows that Rh has a remarkable effect for the corrosion resistance of Nb.

Example 9

In the same procedures as those in the examples described above, the electric resistance and the variation thereof were examined for a Nb-Re alloy, in which 0.5–35 at. % of Re was added to Nb and the addition amount of Re usable for the shunt film was studied. As a result, a range from 3 to 15 at. % is effective in the case of Re.

Also in the case of the addition of Re, if the amount is greater than 15 at. %, the resistance increases remarkably (FIG. 6), and the reaction temperature with the Ni-19 at. % Fe alloy film is reduced to lower than 350° C. near Nb-12 at. % Re due to the increase of the addition amount of Re.

Accordingly, the Nb-Re alloy with more than 17 at. % Re is not practical as the head material when the highest heat treatment temperature exceeds 300° C. in the head manufacturing step.

On the contrary, there is no particular problem for the corrosion resistance of the Nb-Re alloy film within a range from 3 to 15 at. % of Re but the corrosion resistance of the Nb film is rather improved somewhat by the addition of Re.

It has been confirmed for the effect of reducing the variation in electric resistance in the shunt film by the addition of Re within a range of 3 to 15 at. % that it is reduced to about $\frac{1}{3}-\frac{1}{2}$ as compared with the Nb film in the same manner as in the case of adding Ti or Zr. Since the change of the resistance is small but the effect of reducing the variation is not so remarkable with the addition of Re of less than 3 at. %, addition by more than 3 at. % is effective.

After the above-mentioned study, when heads were fabricated like that in the case of adding Ti or Zr by using a Nb-3-15 at. % Re alloy film as the shunt film and a Ni-Fe magnetoresistive film containing 7–27 at. % Fe, a Co-Fe magnetoresistive film containing 30–50 at. % Co and a Ni-Fe-Co magnetoresistive film containing 3–18 at. % Fe, 30–15 at. % Co and the balance of Ni and evaluated, an effect of reducing the variation in the head characteristic due to the effect of reducing the variation in electric resistance of the shunt film has also been confirmed.

Example 10

In the same procedures as those in the examples described above, the electric resistance and the variation thereof were examined for an Nb-Pt alloy, in which 0.5–35 at. % of Pt was added to Nb and the addition amount of Pt usable for the shunt film was studied. As a result, a range from 1 to 10 at. % is effective in the case of Pt.

Also in the case of the addition of Pt, if the amount is greater than 10 at. %, the resistance is remarkably increased (FIG. 6), and the reaction temperature with the Ni-19 at. % Fe alloy film is reduced lower than 350° C. near Nb-12 at. % Pt due to the increase of the addition amount of Pt.

Accordingly, the Nb-Pt alloy with more than 12-at. % Pt is not practical as the head material when the highest heat treatment temperature exceeds 300° C. in the head manufacturing step.

On the contrary, there is no particular problem for the corrosion resistance of the Nb-Pt alloy film within a range from 1 to 10 at. % of Pt but the corrosion resistance of the Nb film is rather improved somewhat by the addition of Pt. It has been confirmed for the effect of reducing the variation in electric resistance in the shunt film by the addition of Pt within a range of 1 to 15 at. % that it is reduced to about $\frac{1}{3}-\frac{1}{2}$ as compared with the Nb film in the same manner as in the case of adding of Ti or Zr.

Since the change of the resistance is small but the effect of reducing the variation is not so remarkable with the addition of Pt of less than 1 at. %, addition by more than 1 at. % is effective.

After the above-mentioned study, like that in the case of adding Ti, Zr, when heads were fabricated by using a Nb-1-10 at. % Pt alloy film as the shunt film and a Ni-Fe magnetoresistive film containing 7–27 at. % Fe, a Co-Fe magnetoresistive film containing 30–50 at. % Co and a Ni-Fe-Co magnetoresistive film containing 3–18 at. % Fe, 30–15 at. % Co and the balance of Ni and evaluated, an effect of reducing the variation in the head characteristic due to the effect of reducing the variation in electric resistance of the shunt film has also been confirmed.

Example 11

In the same procedures as those in the examples described above, the electric resistance and the variation thereof were examined for an Nb-Ni alloy, in which 0.5–35 at. % of Ni was added to Nb and the addition amount of Ni usable for the shunt film was studied. As a result, a range from 3 to 25 at. % is effective in the case of Ni.

Also in the case of the addition of Ni, if the amount is greater than 10 at. %, the resistance is remarkably increased (FIG. 6), and the reaction temperature with the Ni-19 at. % Fe alloy film is not substantially different from the reaction temperature in the case of using the Nb film alone even when the addition amount of Ni is increased.

Further, for the corrosion resistance of the Nb-Ni alloy film, there is no problem at all within a range from 3 to 25 at. %, and it rather provides a result of improving the corrosion resistance of the Nb film by the addition of Ni. Accordingly, the effective addition amount is determined in the case of the adding Ni by the remarkable increase of the resistance at the addition amount of greater than 25 at. %.

It has been confirmed for the effect of reducing the variation in electric resistance of the shunt film by the addition of Ni within a range from 3 to 25 at. % that it is reduced to about $\frac{1}{3}-\frac{1}{2}$ as compared with the Nb film in the same manner as in the examples described above. Since the change of the resistance is small but the effect of reducing the variation is not so remarkable with the addition amount of Ni of less than 3 at. %, addition of by more than 3 at. % is effective.

After the above-mentioned study, like that in the case of adding Ti or Zr, when heads were fabricated by using a Nb-3-25 at. % Ni alloy film as the shunt film and a Ni-Fe magnetoresistive film containing 7–27 at. % Fe, a Co-Fe magnetoresistive film containing 30–50 at. % Co and a Ni-Fe-Co magnetoresistive film containing 3-18 at. % Fe, 3-15 at. % Co and the balance of Ni and evaluated, an effect of reducing the variation in the head characteristic due to the effect of reducing the variation in electric resistance of the shunt film has also been confirmed.

Example 12

In the same procedures as those in the examples described above, the electric resistance and the variation thereof were examined for a Nb-Cr alloy, in which 0.1-35 at. % of Cr was added to Nb and the addition amount of Cr usable for the shunt film was studied. As a result, it has been found that a narrow range from 0.2 to 5 at. % is effective in the case of Cr.

This is because the increase for the resistance of the Nb film by the addition of Cr is remarkable, and the resistance further increases rapidly at greater than 7 at. % (FIG. 6), as well as because the reduction in reaction temperature with the Ni-19 at. % Pe alloy film by the addition of Cr is large and, as the addition amount is increased, the temperature is reduced lower than 350° C. already near Nb-6 at. % Cr. Accordingly, the Nb-Cr alloy with more than 8 at. % Cr is not practical as the head material when the highest heat treatment temperature exceeds 300° C. in the head manufacturing step.

For the corrosion resistance of the Nb-Cr alloy film, there is no particular problem even by the addition of greater than 10 at. %.

It has been confirmed for the effect of reducing the variation in electric resistance of the shunt film by the addition of Cr within a range from 0.2-5 at. % Cr that it is reduced to about ⅓-½ as compared with the Nb film in the same manner as in the examples described above. Since the range of the resistance is small but the effect of reducing the variation is not so remarkable with the addition of Cr of less than 0.2 at. %, addition of by more than 0.2 at. % is effective.

After the above-mentioned study, like that in the case of adding Ti or Zr, when heads were fabricated by using a Nb-0.2-5 at. % Cr alloy film as the shunt film and a Ni-Fe magnetoresistive film containing 7-27 at. % Fe, a Co-Fe magnetoresistive film containing 30-50 at. % Co and a Ni-Fe-Co magnetoresistive film containing 3-18 at. % Fe, 3-15 at. % Co and the balance of Ni and evaluated, an effect of reducing the variation in the head characteristic due to the effect of reducing the variation in electric resistance of the shunt film has also been confirmed.

Example 13

In the same procedures as those in the examples described above, the electric resistance and the variation thereof were examined for a Nb-Mo alloy, in which 0.5-35 at. % of Mo was added to Nb and the addition amount of Mo usable for the shunt film was studied. As a result, a range from 3 to 8 at. % is effective also in the case of Mo.

This is because the increase for the resistance of the Nb film by the addition of Mo is remarkable, and the resistance increases rapidly at greater than 10 at. % (FIG. 6), the corrosion resistance is remarkably reduced by the addition of Mo and, accordingly, the Nb-Mo alloy with more than 9 at. % Mo is not practical as the head material in view of the corrosion resistance.

There is no particular problem for the reaction temperature with the Ni-19 at. % Fe alloy film and it is kept higher than 350° C. even when a relatively large amount of Mo (about 15 at. %) is added.

It has been confirmed for the effect of reducing the variation in electric resistance of the shunt film by the addition of Mo within a range from 3-8 at. % Mo that it is reduced to about ⅓-½ as compared with the Nb film in the same manner as in the examples described above. Since the change of the resistance is small but the effect of reducing the variation is not so remarkable with the addition of Mo of less than 3 at. %, addition by more than 3 at. % is effective.

After the above-mentioned study, like that in the case of adding Ti or Zr, when heads were fabricated by using a Nb-3-8 at. % Mo alloy film as the shunt film and a Ni-Fe magnetoresistive film containing 7-27 at. % Fe, a Co-Fe magnetoresistive film containing 30-50 at. % Co and a Ni-Fe-Co magnetoresistive film containing 3-18 at. % Fe, 3-15 at. % Co and the balance of Ni and evaluated, an effect of reducing the variation in the head characteristic due to the effect of reducing the variation in electric resistance of the shunt film has also been confirmed.

Example 14

Figure 7:
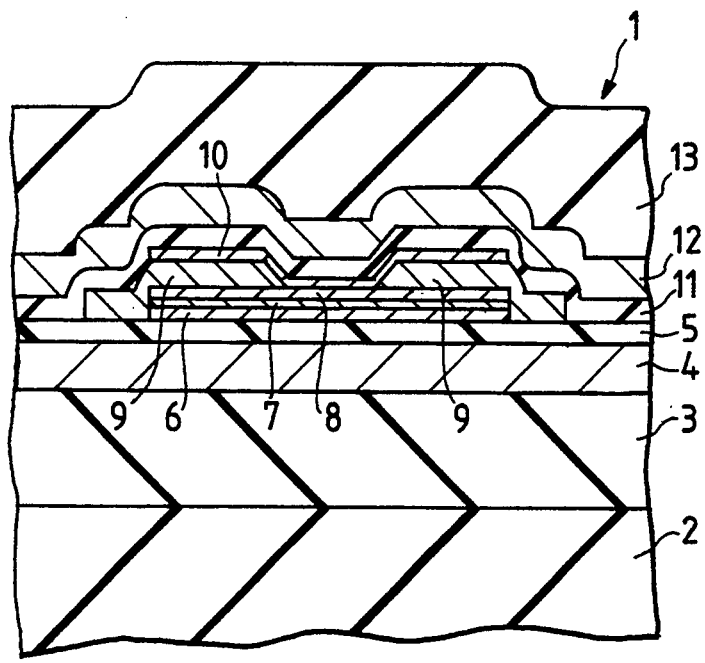
FIG. 7 is a cross sectional view of a magnetoresistive magnetic head on the side opposing to a medium in an embodiment according to the present invention.

FIG. 7 shows a cross sectional view of a magnetoresistive magnetic head in one embodiment according to the present invention as viewed from the side opposing to a medium.

In the magnetoresistive magnetic head 1 in this example, the Nb alloy film, the Ni-Fe alloy film, the Ni-Co alloy film or the Ni-Fe-Co alloy film described in Examples 1 to 13 were used as a shunt film 8 and a magnetoresistive film 6. Referring to the method of manufacturing the magnetoresistive magnetic head 1, a lower magnetic shield layer 4 is at first stacked by from 1 to 3 μm by way of an insulation layer 3, for example, of aluminum deposited in a large thickness for flattening on a substrate 2 of an appropriate thickness comprising ceramics such as zirconia, fabricated into a predetermined shape by photolithography and dry etching and then an insulation layer 5 comprising aluminum for forming a gap layer was laminated by from 0.05 to 0.4 μm. Each of the layers was stacked by sputtering. The magnetoresistive film 6, an antiferromagnetic film 7 for domain suppression and the Nb alloy shunt film 8 were continuously prepared on them by using vapor deposition and sputtering, fabricated into a predetermined shape by photolithography and dry etching and then Au or Cu, Au-Cu alloy or the like of an electrode film 9 was stacked by sputtering. In this case, it is necessary to slightly apply sputter etching before stacking in order to eliminate spontaneously oxidized layers formed on the surface of the shunt film. After stacking the electrode film, it was fabricated into a predetermined electrode shape for determining a track width by photolithography and dry etching or wet etching to form the electrode 9.

In this case, film thicknesses for the magnetoresistive film 6, the anti-ferromagnetic film 7 for domain suppression, the Nb alloy shunt film 8 and the electrode film were defined as 5-50 nm, −40 nm, 5-150 nm and 50-500 nm, respectively. Further, a Fe-Mn-Ru alloy film or a Fe-Mn alloy film was used for the antiferromagnetic film 7 for domain suppression. After forming the electrode 9 in this way, a soft magnetic biasing film 10 for enhancement of the bias field was stacked to 5-50 nm and then fabricated into an identical shape to the magnetoresistive film in the same manner. Further, after stacking an insulation layer 11 comprising aluminum by 0.05 to 0.4 μm for forming an upper gap layer by sputtering, an upper magnetic shield layer 12 was stacked finally, fabricated into a predetermined shape, and then an insulation layer 13 as a protection film was stacked to complete the manufacture of the magnetoresistive magnetic head 1.

Figure 8:
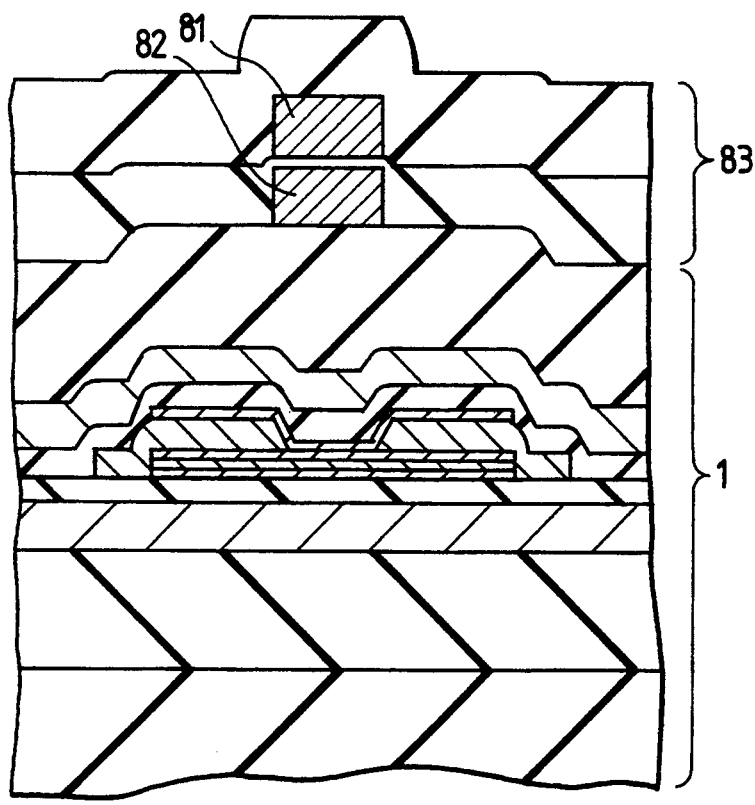
FIG. 8 is a cross sectional view of a recording/reproduction separation type dual head manufactured by using the magnetoresistive magnetic head shown in FIG. 7.

In the case of actually using the magnetoresistive head 1, a recording magnetic head is stacked above or below (before stacking and forming the head) and used in the form of a dual head. FIG. 8 shows a cross sectional view of the dual head. A recording magnetic head 83 was formed on the magnetoresistive head 1 as a dual head capable of recording and reproduction. Reference numerals 81 and 83 denote magnetic cores for the recording magnetic head. The constitution of the magnetoresistive head is the same as that shown in FIG. 7.

Figure 9:
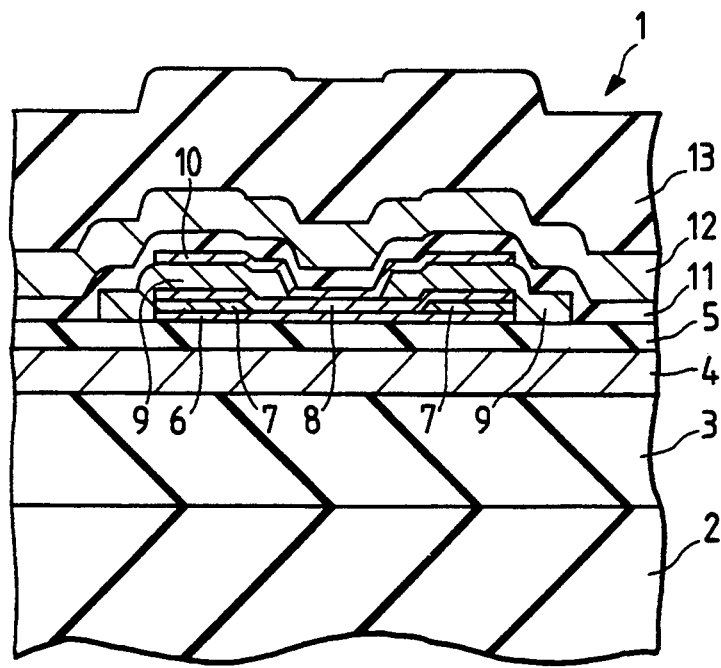
FIG. 9 is a cross sectional view for a modified example of the magnetoresistive magnetic head shown in FIG. 7.

In the example shown in FIG. 7, the antiferromagnetic film 7 for domain suppression is formed over the entire surface of the magnetoresistive film, but it is more preferred to form the film 7 not on the entire surface but on optional both sides excluding the track area of the magnetoresistive film in the case where the effect of domain suppression is strong. FIG. 9 shows a cross sectional view of the head in this case. Other portions and reference numerals therefor are the same as those in FIG. 7.

When signal magnetic fluxes from a recording medium are read by the magnetoresistive head 1, a sense current is caused to flow through the electrode 9 to a stacked film comprising the soft magnetic bias film 10, the Nb alloy shunt film 8, the antiferromagnetic film 7 for domain suppression and the magnetoresistive film 6, to provide a state in which an appropriate bias field is applied to the magnetoresistive film 6. The sense current is shunted in inverse proportion to the resistance to each of the films. Since a magnetic field formed by a current flowing through the films other than the magnetoresistive film is applied as a bias field, as well as a magnetic field comprising a magnetic field including a current magnetic field due to the magnetoresistive film returning by way of the soft magnetic bias film 10 again to the magnetoresistive film 6 is also applied as a bias field, it is necessary to control the sense current and the thickness for each of the films while considering the output such that the two magnetic fields joined together just provide an optimally biased state to the magnetoresistive film 6.

In the optimally biased state, magnetization in the magnetoresistive film makes an angle of about 45° relative to the direction of the sense current and, when signal magnetic fluxes enter from the medium, the angle of the magnetoresistive film relative to the sense current also increases or decreases relative to 45° depending on the direction of the signal magnetic flux. Since the resistance of the magnetoresistive film is decreased or increased corresponding to this, the change of the resistance is detected from the electrode as a change of voltage and the signals can be read. In such an optimally biased state, the output of the head becomes greatest and the symmetricity of the output of different polarities is the best. On the contrary, if the optimally biased state is lost, the output is lowered and the symmetricity is worsened to deteriorate the head characteristics making, it impossible for actual use.

In the case of mass-producing the heads, it is inevitable that the state of bias varies from the optimum state between each of the heads with respect to the constant sense current value. However, if the variation is increased, it leads to the reduction of the yield. The variation is caused mainly by the variation in the bias field due to the variation in the resistance of the shunt film, the soft magnetic bias film and the antiferromagnetic film for domain suppression. Among them, the effect of the variation in resistance of the shunt film is particularly remarkable since the resistance of the shunt film is low. In this regard, since the Nb alloy shunt film with extremely less variation in resistance is used for the shunt film as described above in this example, the variation in view of the asymmetricity of the head output was reduced to about $\frac{1}{3}-\frac{1}{2}$ as compared with the case of using the Nb shunt film. Further, in this example, the Barkhausen noise known to be generated in the magnetoresistive head could be suppressed substantially completely in this example by the effect of the antiferromagnetic film for domain suppression stacked on the magnetoresistive film. This example has the effect just described above.

In this example, the soft magnetic bias film 10 was stacked directly on the Nb alloy shunt film 8 for the enhancement of the bias field. However, the same effect is obtained by disposing the film by way of an insulation layer put between the shunt film instead of direct stacking, and further, a hard magnetic bias film may be used instead of the soft magnetic bias film. Further, if a sufficient bias is applied, there is no particular requirement for using the magnetic film for the enhancement of the bias. Furthermore, although the antiferromagnetic film 7 is stacked in continuous with the magnetoresistive film for domain suppression of the magnetoresistive film 6, a hard magnetic film may be used instead. In each of the cases, since the Nb alloy shunt film is used, an effect of reducing the variation in the head output to about $\frac{1}{3}-\frac{1}{2}$ is obtained.

Example 15

In the magnetoresistive magnetic head in this example, a structure comprising the magnetoresistive film 6, the antiferromagnetic film 7 for domain suppression, the Nb alloy shunt film 8, the electrode film 9, and further, the soft magnetic bias film 10 stacked in this order in the magnetoresistive magnetic head 1 of Example 14 shown in FIG. 7, is replaced with the order of previously stacking the soft magnetic bias film 10 subsequent to the Nb alloy shunt film 8, fabricating the same into a predetermined shape and, finally, forming the electrode 9. Other structures are quite identical to those in Example 14, and all of the manufacturing procedures were also identical. Further, also in this example, the Nb alloy film, the Ni-Fe alloy film, the Ni-Co alloy film or the Ni-Fe-Co alloy film as described in Examples 1-13 are of course used as the shunt film and the magnetoresistive film. Accordingly, the operation, the function and the effect of the magnetoresistive magnetic head in this example are quite identical to those in the magnetoresistive magnetic head 1 in Example 14. It is also necessary in the case of the magnetoresistive magnetic head in this example to stack a recording magnetic head above or below (before stacking and forming the head) and use it in the form of a dual head.

Further, also in this example, a hard magnetic bias film may be used instead of the soft magnetic bias film and, furthermore, a hard magnetic film may be used instead of the antiferromagnetic film for domain suppression of the magnetoresistive film. However, in each of the cases, an effect of reducing the variation in the head output to about $\frac{1}{3}-\frac{1}{2}$ can also be obtained since the Nb alloy shunt film is used.

Example 16

In the magnetoresistive magnetic head in this example, a structure comprising the magnetoresistive film 6, the antiferromagnetic film 7 for domain suppression, the Nb alloy shunt film 8, the electrode film 9 and, further, the soft magnetic bias film 10 stacked in this order in the magnetoresistive magnetic head 1 of Example 14 shown in FIG. 7 is replaced with the order of stacking the magnetoresistive film 6 and the antiferromagnetic film 7 for domain suppression, fabricating the same into a predetermined shape, successively, forming the electrode 9 at first and then continuously stacking the Nb alloy shunt film 8 and the soft magnetic bias film 10 and then fabricating them into a predetermined shape. Other structures are quite identical to that in Example 14 and all of the manufacturing procedures were identical. Further, the Nb alloy film, the Ni-Fe alloy film, the Ni-Co alloy film or the Ni-Fe-Co alloy film as described in Examples 1–13 are of course used as the shunt film and the magnetoresistive film also in this example. Accordingly, the operation, the function and the effect of the magnetoresistive magnetic head in this example are quite identical to those in the magnetoresistive magnetic head 1 in Example 14. It is necessary also in the case of actually using the magnetoresistive magnetic head in this example to stack a recording magnetic head for recording above or below (before stacking and forming the head) and use them in the form of a dual head.

Further, also in this example, the soft magnetic bias film is directly stacked on the Nb alloy shunt film, but the effect is identical if an insulation layer is interposed between it and the shunt film instead of the direct stacking. Further, a hard magnetic bias film may be used instead of the soft magnetic bias film. Further, if a bias is sufficient, there is no particular requirement for using the magnetic film for the bias enhancement. Furthermore, a hard magnetic film may be used instead of the antiferromagnetic film for domain suppression of the magnetoresistive film. However, in each of the cases, an effect of reducing the variation in the head output to about $\frac{1}{3}-\frac{1}{2}$ can also be obtained since the Nb alloy shunt film is used.

Example 17

In the magnetoresistive magnetic head in this example, a structure comprising the magnetoresistive film 6, the antiferromagnetic film 7 for domain suppression, the Nb alloy shunt film 8, the electrode film 9 and, further, the soft magnetic bias film 10 stacked in this order, in the magnetoresistive magnetic head 1 of Example 14 shown in FIG. 7 or in Example 15 is replaced with a structure of at first stacking the antiferromagnetic film 7 for domain suppression, fabricating the same into a predetermined shape, successively, stacking the magnetoresistive film 6, the Nb alloy shunt film 8 and the soft magnetic bias film 10, then fabricating them into a predetermined shape and finally forming the electrode 9. Other structures are quite identical to that in Example 14 and all of the manufacturing procedures were identical.

However, in the case of this example, it is necessary for controlling the crystalline structure of the antiferromagnetic film to stack a Ni-Pe alloy film into a thickness greater than several tens Å previously before stacking the antiferromagnetic film 7, then continuously stacking the antiferromagnetic film and, further, stacking the Ni-Pe alloy film continuously to a thickness of more than several tens Å in order to prevent the oxidation of the antiferromagnetic film.

Further, the Nb alloy film, the Ni-Fe alloy film, the Ni-Co alloy film or the Ni-Fe-Co alloy film as described in Examples 1–13 is of course used as the shunt film and the magnetoresistive film also in this example. Accordingly, the operation, the function and the effect of the magnetoresistive magnetic head in this example are quite identical to those in the magnetoresistive magnetic head 1 in Examples 14 and 15. It is necessary also in the case of actually using the magnetoresistive magnetic head in this example to stack a recording magnetic head for recording above or below (before stacking and forming the head) and use them in the form of a dual head.

Further, also in this example, the soft magnetic bias film is directly stacked on the Nb alloy shunt film, but the effect is identical if an insulation layer is interposed between it and the shunt film instead of the direct stacking. Further, a hard magnetic bias film may be used instead of the soft magnetic bias film. Further, if a bias is sufficient, there is no particular requirement for using the magnetic film for the bias enhancement. Furthermore, a hard magnetic film may be used instead of the antiferromagnetic film for domain suppression of the magnetoresistive film. However, in each of the cases, the effect of reducing the variation in the head output to about $\frac{1}{3}-\frac{1}{2}$ can also be obtained since the Nb alloy shunt film is used.

Example 18

In the magnetoresistive magnetic head in this example, a structure comprising the magnetoresistive film 6, the antiferromagnetic film 7 for domain suppression, the Nb alloy shunt film 8 and the electrode film 9 stacked in this order in the magnetoresistive magnetic head 1 of Example 14 shown in FIG. 7 is replaced with a structure of at first stacking the Nb alloy shunt film 8, successively stacking the magnetoresistive film 8, the antiferromagnetic film 7 for domain suppression and the electrode film 9, in this order. Other structures are quite identical to those in Example 14 and the manufacturing procedures were also identical. Further, also in this example, the Nb alloy film, the Ni-Fe alloy film, the Ni-Co alloy film or the Ni-Pe-Co alloy film as described in Examples 1–13 is of course used as the shunt film and the magnetoresistive film. Accordingly, the operation, the function and the effect of the magnetoresistive magnetic head in this example are quite identical to those in the magnetoresistive magnetic head 1 in Example 14. It is also necessary in the case of actually using the magnetoresistive magnetic head in this example to stack a recording magnetic head above or below (before stacking and forming the head) and use it in the form of a dual head.

Example 19

Figure 10:
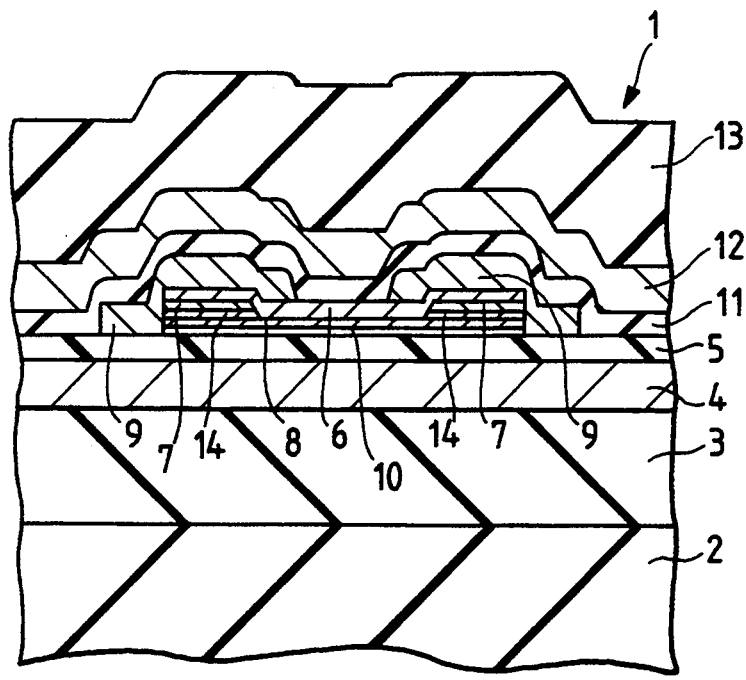
FIG. 10 is a cross sectional view of a magnetoresistive magnetic head on the side opposing to a medium in another embodiment according to the present invention.

FIG. 10 is a cross sectional view of a magnetoresistive magnetic head in another embodiment of the present invention as viewed from the side opposing to a medium. Also in the magnetoresistive magnetic head 1 in this example, the Nb alloy film, the Ni-Fe alloy film, the Ni-Co alloy film or the Ni-Fe-Co alloy film as described in Examples 1 to 13 is used as the shunt film 8 and the magnetoresistive film 6. Further, in the magnetoresistive magnetic head 1 in this example, a structure comprising the magnetoresistive film 6, the antiferromagnetic film 7 for domain suppression, the Nb alloy shunt film 8, the electrode film 9 and the soft magnetic bias film 10 stacked in this order in the magnetoresistive magnetic head 1 of Example 14 shown in FIG. 7 is reversed substantially into the order of stacking the soft magnetic bias film 10, the Nb alloy shunt film 8, the antiferromagnetic film 7 for domain suppression and the magnetoresistive film 6, fabricating them into a predetermined shape and, finally, stacking the electrode film to form the electrode 9. Other structures are quite identical to those in Example 14. Accordingly, details for the method of manufacturing the magnetic head 1 are omitted and, in the case of stacking the antiferromagnetic film 7 on the Nb alloy shunt film 8 in the magnetic head 1, it is necessary to previously stack about several hundreds Å of a Ni-Fe alloy film 14 previously on the Nb alloy shunt film 8 for controlling the crystalline structure of the antiferromagnetic film. However, this is not particularly necessary in the case of using a hard magnetic film instead of the antiferromagnetic film for the stabilization of the domain. The magnetoresistive magnet head 1 of this example also have the same operation, function and effect as those in the magnetoresistive magnetic head 1 in Example 14. Also in the case of actually using the magnetoresistive magnetic head 1 in this example, it is necessary to stack a recording magnetic head above or below and use them in the form of a dual head.

On the other hand, in this example, the soft magnetic bias film is directly stacked on the Nb alloy shunt film 8, but the effect is identical if an insulation layer is interposed between it and the shunt film instead of the direct stacking. Further, a hard magnetic bias film may be used instead of the soft magnetic bias film. Further, if a bias is sufficient, there is no particular requirement for using the magnetic film for the bias enhancement. However, in any case, an effect of reducing the variation in the head output to about $\frac{1}{5}-\frac{1}{2}$ can be obtained since the Nb alloy shunt film is used.

Example 20

In the magnetoresistive magnetic head in this example, a structure comprising the Nb alloy shunt film 8, the antiferromagnetic film 7 for domain suppression, the magnetoresistive film 6 and the electrode 9 in this order is replaced with a structure of at first stacking the magnetoresistive film 6 subsequent to the Nb alloy shunt film 8, then successively stacking the antiferromagnetic film 7 for domain suppression, then fabricating them into a predetermined shape and then forming the electrode 9. This makes it unnecessary to stack the Ni-Fe alloy film 14 for controlling the crystalline structure of the antiferromagnetic film between the Nb alloy shunt film 8 and the antiferromagnetic film 7. Other structures are the same as those in Example 19 and the manufacturing method is also identical. Further, also in this example, the Nb alloy film, the Ni-Fe alloy film, the Ni-Co alloy film or the Ni-Fe-Co alloy film as described in Examples 1 to 13 is of course used as the shunt film and the magnetoresistive film. Accordingly, the operation, the function and the effect of the magnetoresistive magnetic head in this example are quite identical to those in the magnetoresistive magnetic head 1 in Example 19. It is necessary also in the case of actually using the magnetoresistive magnetic head in this example to stack a recording magnetic head for recording above or below and use them in the form of a dual head.

Example 21

The magnetoresistive head shown in Examples 14 to 20 was at first fabricated on a ceramic insulation substrate, on which a thin alumina film was stacked to about 3 μm as an insulation film and, further, magnetic poles, coils, electrodes, etc. required for forming an induction type recording head were stacked to form a recording/reproduction separation type dual head as schematically shown in FIG. 8 and reproduction characteristics were evaluated by using a Co-Ta-Cr magnetic disc. As a result, S/N at 3.5 was obtained, and the scattering of the output was also reduced to $\frac{1}{3}-1/5$ as compared with existent heads using Nb and Ti as the shunt film.

Example 22

Lower magnetic poles of an induction type recording head were formed on a ceramic insulation substrate and an alumina insulation film was stacked to prepare the magnetoresistive device. Further, upper electrodes were formed by way of the alumina insulation film to prepare a recording/reproduction separation type dual head and the reproducing characteristics were evaluated by using a Co-Ta-Cr magnetic disc as a medium. As a result, S/N at 3.5 was obtained, and the variation in the output was also reduced to $\frac{1}{3}-1/5$ as compared with existent heads using Nb and Ti as the shunt film.

Example 23

A magnetoresistive device was prepared by way of an insulation film on a magnetic ferrite substrate, and a soft magnetic film such as made of magnetic ferrite or permalloy was formed as a shield by way of the alumina insulation film to form a reproduction head. Such a reproduction head and a recording head prepared by winding coils between two ferrite cores are mechanically integrated to prepare a recording/ reproduction separation type dual head, which was mounted on a magnetic tape apparatus and driven by a constant voltage power source. The output in this case at 38 kfci was 3-4 mV, and variation was extremely reduced as compared with 1-3 mV of the output of existent heads using Ti or Nb as the shunt film.

Example 24

A recording/reproduction separation type dual head using the magnetoresistive head described in Examples 14 to 20 using the Nb alloy film, for example, the Nb-15% Ti alloy film according to the present invention was mounted on a magnetic disc apparatus. When the signal reproduction error ratio of the magnetic disc apparatus was compared with that of the existent apparatus, the error ratio was improved by about two digits.

Example 25

When the recording/reproduction separation type dual head using the Nb alloy film, for example, Nb-15% Ti alloy film according to the present invention was used and the S/N ratio for the reproduction signal was evaluated by using an identical magnetic medium of Co-Ta-Cr system, about 0.3 to 0.7 of improvement was observed for the S/N ratio.

In the present invention, as has been described above also with reference to the examples, since an Nb alloy film in which a secondary element is added to the Nb film is used as the shunt film, the variation in electric resistance as the shunt film can be reduced extremely as compared with the case of using the Nb film and, accordingly, it can provide an effect of reducing the variation in the bias field intensity of the head caused by the variation in electric resistance of the shunt film to less than ⅓–½ in the case of the Nb film when comparison is made with respect to the vertical asymmetricity of the head output waveform. Accordingly, it also can provide an effect of remarkably increasing the head characteristics as caused by the vertical asyrmmetricity of the head output waveform, in particular, in the S/N ratio and remarkable reduction in variation.

On the other hand, when the recording/reproduction separation type dual head using the magnetoresistive magnetic head according to the present invention is used to an actual magnetic recording apparatus, since it is possible to remarkably improve the head characteristics such as S/N ratio and remarkable reduction of the variation in the head characteristics, there is no more requirement for providing a power source for supplying power to the device with a circuit function of reducing the variation, and the burden imposed on the power source is remarkably moderated. At the same time, since the reproduction error ratio of signals upon recording/ reproduction can also be reduced, the burden imposed on the error correction circuit can be moderated remarkably. Accordingly, a magnetic recording apparatus with extremely low error ratio can be obtained in accordance with the present invention.

Example 26

As a method of applying a bias field in the magnetoresistive head, there has been a method of using a soft magnetic film as described in U.S. Pat. Nos. 4,663,685 and 5,001,586. The fundamental constitution of the magnetoresistive head using the soft magnetic film comprises a three-layer structure consisting of a soft magnetic film, spacer metal film and a magnetoresistive film.

By forming the spacer metal film with the Nb alloy already described, a reproduction head with a high efficiency can be obtained. That is, by adding the secondary element to Nb to increase the resistance, shunting of the sense current to the soft magnetic film can be prevented without increasing the thickness of the spacer metal film, so that a spacer metal film with no variation in electric resistance can be formed. As a result, variation in the output of the magnetoresistive head can be prevented.

Figure 11:
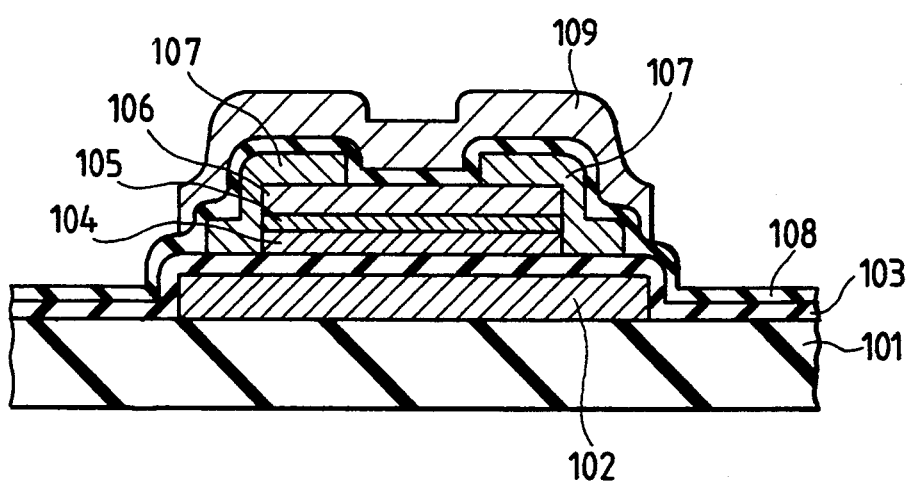
FIG. 11 is a cross sectional view of a magnetoresistive magnetic head on the side opposing to a medium in another embodiment according to the present invention.

This example is shown in FIG. 11. A Ni-19 at. % Fe film was deposited to a thickness of 1 $\mu$m by sputtering as a magnetic shield film 102 on a non-magnetic insulation substrate 101 and, after applying fine fabrication into a predetermined shape, an $Al_2O_3$ film 103 as an insulation film was stacked to a thickness of 0.2 $\mu$m, on which a (Ni-19 at. % Fe) - 6 at. % Ru film 104 was stacked to a thickness of 50 nm as a soft magnetic film and, successively, a Nb-10 at. % Ta alloy film 105 as a highly resistive metal was deposited to a thickness of 10 nm and, successively, a Ni-19 at. % Fe film as a magnetoresistive film 106 was deposited to a thickness of 50 nm and fabricated into a predetermined shape to form an electrode 107. Subsequently, an insulation $Al_2O_3$ film 108 was deposited to a thickness of 0.2 $\mu$m, on which a Ni-19 at. % Fe film as a magnetic shield layer 109 was deposited to a thickness of 1 $\mu$m by sputtering.

In order to obtain a dual head capable of recording-/reproduction, $Al_2O_3$ is further deposited thereover to a thickness of 2 $\mu$m, to form a recording induction type thin film head.

In this example, it is sufficient that the thickness of the Nb alloy film is greater than 20 Å. However, since the formation is difficult if the thickness is too small, a thickness of greater than 50 Å is desirable for easy formation. It is generally from 100 to 200 Å. On the contrary, if the thickness is too large, it takes much time for the formation and is not desirable. Also in this example, a film of high resistance with less variation in resistance value can be obtained by adding the secondary element to Nb and, as a result, the variation in the output between the individual heads could be eliminated.

In this example, various kinds of elements used in the examples described previously can be used for the additive elements. In the case of using it as the spacer metal film, the additive amount of the secondary element is determined in view of the corrosion resistance and the reaction resistance. The amount of the additive element is less than 30 at. % for Ti in view of the reaction resistance, less than 12 at. % for Zr in view of the corrosion resistance, less than 22 at. % for V in view of the reaction resistance, less than 27 at. % for Hf in view of the reaction resistance, less than 6 at. % for W in view of the corrosion resistance, less than 27 at. % for Ta in view of the reaction resistance, less than 37 at. % for Ru in view of the reaction resistance, less than 27 at. % for Rh in view of the reaction resistance, less than 17 at. % for Re in view of the reaction resistance, less than 12 at. % for Pt in view of the reaction resistance, no particular restriction for Ni in view of the reaction resistance and the corrosion resistance, less than 6 at. % for Cr in view of the reaction resistance, and less than 9 at. % for Mo in view of the corrosion resistance.

Further, for obtaining the remarkable increase of the specific resistivity, addition by more than 0.5–1 at. % is desirable as shown in FIG. 6.

What is claimed is:

1. A magnetoresistive head having a two-layer film and a pair of spaced electrodes for supplying current to said two-layered film, said two-layered film comprising a magnetoresistive film exhibiting a magnetoresistive effect and a shunt film provided adjacent said magnetoresistive film at least at a magnetosensitive region between said spaced electrodes for applying a bias magnetic field, said shunt film comprising Nb and at least one element, as an additive element, selected from the group consisting of Ti, Cr, Mo, Zr, W, Pt, Re, V, Hf, Ta, Rh, Ni and Ru.

2. A magnetoresistive head as defined in claim 1, wherein the magnetoresistive film comprises a Ni-Fe alloy in which the composition thereof ranges between Ni-7 at. % Fe and Ni-27 at. % Fe.

3. A magnetoresistive head as defined in claim 1, wherein the magnetoresistive film comprises a Ni-Co alloy in which the composition thereof ranges between Ni-30 at. % Co and Ni-50 at. % Co.

4. A magnetoresistive head as defined in claim 1, wherein the magnetoresistive film comprises a Ni-Fe-Co alloy in which the composition comprises 3–18 at. % Fe, 3–15 at. % Co and the balance of Ni.

5. A magnetoresistive head as defined in claim 1, wherein the shunt film is a Nb-Mo alloy and the Mo content is from 3 to 8 at. %.

6. A magnetoresistive head as defined in claim 1, wherein a third film exhibiting a soft magnetic property is stacked on the magnetoresistive film via the shunt film.

7. A magnetoresistive head as defined in claim 1, wherein the Nb alloy of the shunt film is a solid solution.

8. A magnetoresistive head as defined in claim 1, wherein the shunt film is a Nb-Ti alloy and the Ti content is from 1 to 25 at. %.

9. A magnetoresistive head as defined in claim 1, wherein the shunt film is a Nb-Zr alloy and the Zr content is from 0.5 to 10 at. %.

10. A magnetoresistive head as defined in claim 1, wherein the shunt film is a Nb-V alloy and the V content is from 3 to 20 at. %.

11. A magnetoresistive head as defined In claim 1, wherein the shunt film is a Nb-Hf alloy and the Hf content is from 1 to 25 at. %.

12. A magnetoresistive head as defined in claim 1, wherein the shunt film is a Nb-W alloy and the W content is from 0.5 to 5 at. %.

13. A magnetoresistive head as defined in claim 1, wherein the shunt film is a Nb-Ta alloy and the Ta content is from 3 to 25 at. %.

14. A magnetoresistive head as defined in claim 1, wherein the shunt film is a Nb-Ru alloy and the Ru content is from 3 to 35 at. %.

15. A magnetoresistive head as defined in claim 1, wherein the shunt film is a Nb-Rh alloy and the Rh content is from 3 to 25 at. %.

16. A magnetoresistive head as defined in claim 1, wherein the shunt film is a Nb-Re alloy and the Re content is from 3 to 15 at. %.

17. A magnetoresistive head as defined in claim 1, wherein the shunt film is a Nb-Pt alloy and the Pt content is from 1 to 10 at. %.

18. A magnetoresistive head as defined in claim 1, wherein the shunt film is a Nb-Ni alloy and the Ni content is from 3 to 25 at. %.

19. A magnetoresistive head as defined in claim 1, wherein the shunt film is a Nb-Cr alloy and the Cr content is from 0.2 to 5 at. %.

20. A magnetoresistive head having a two-layer film and a pair of spaced electrodes for supplying current to said two-layer film; said two-layer film comprising a magnetoresistive film and a shunt film provided adjacent said magnetoresistive film at least at a magnetosensitive region between said spaced electrodes for applying a bias magnetic field, said shunt film containing Nb as the main ingredient and at least one element, as an additive element, selected from the group consisting of Cr, Mo, Zr, W, Pt, Re, V, Hf, Ta, Rh, Ni and Ru; wherein a magnetic field formed by a current shunted to said shunt film is applied as a bias field to said magnetoresistive film.

21. A magnetoresistive head having a three-layer film and a pair of spaced electrodes for supplying current to said three-layer film, said three-layered film comprising a magnetoresistive film, a soft magnetic film, and an intermediate film provided between said magnetoresistive film and said soft magnetic film at least at a magnetosensitive region between said spaced electrodes for preventing sense current from shunting to said soft magnetic film, said intermediate film containing Nb as the main ingredient and at least one element, as an additive element, selected from the group consisting of Cr, Mo, Zr, W, Pt, Re, V, Hf, Ta, Rh, Ni and Ru, wherein a magnetic field by said soft magnetic film is applied as a bias field to said magnetoresistive film.

22. A thin film material used for a magnetoresistive head containing Nb as the main ingredient and at least one additive element selected from the group consisting of less than 30 at. % Ti, less than 6 at. % Cr, less than 9 at. % Mo, less than 12 at. % Zr, less than 6 at. % W, less than 12 at. % Pt, less than 17 at. % Re, less than 22 at. % V, less than 27 at. % Hf, less than 27 at. % Ta, less than 27 at. % Rh, less than 25 at. % Ni and less than 37 at. % Ru.

23. A material as defined in claim 22, wherein the additive element is Mo contained by less than 9 at. % in view of the corrosion resistance.

24. A material as defined in claim 22, wherein the additive element is Ti contained by less than 30 at. % in view of the reaction resistance.

25. A material as defined in claim 22, wherein the additive element is Zr contained by less than 12 at. % in view of the corrosion resistance.

26. A material as defined in claim 22, wherein the additive element is V contained by less than 22 at. % in view of the reaction resistance.

27. A material as defined in claim 22, wherein the additive element is Hf contained by less than 27 at. % in view of the reaction resistance.

28. A material as defined in claim 22, wherein the additive element is W contained by less than 6 at. % in view of the corrosion resistance.

29. A material as defined in claim 22, wherein the additive element is Ta contained by less than 27 at. % in view of the reaction resistance.

30. A material as defined in claim 22, wherein the additive element is Ru contained by less than 37 at. % in view of the reaction resistance.

31. A material as defined in claim 22, wherein the additive element is Rh contained by less than 27 at. % in view of the reaction resistance.

32. A material as defined in claim 22, wherein the additive element is Re contained by less than 17 at. % in view of the reaction resistance.

33. A material as defined an claim 22, wherein the additive element is Pt contained by less than 12 at. % in view of the reaction resistance.

34. A material as defined an claim 22, wherein the additive element is Cr contained by less than 6 at. % in view of the reaction resistance.

* * * * *